US010153917B1

(12) United States Patent
Tonietto et al.

(10) Patent No.: US 10,153,917 B1
(45) Date of Patent: Dec. 11, 2018

(54) FREQUENCY/PHASE-SHIFT-KEYING FOR BACK-CHANNEL SERDES COMMUNICATION

(71) Applicants: Davide Tonietto, Ottawa (CA); Dustin Tarl Dunwell, Toronto (CA); Anthony Chan Carusone, Burlington (CA)

(72) Inventors: Davide Tonietto, Ottawa (CA); Dustin Tarl Dunwell, Toronto (CA); Anthony Chan Carusone, Burlington (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/656,938

(22) Filed: Jul. 21, 2017

(51) Int. Cl.
*H04L 12/40* (2006.01)
*H04L 25/03* (2006.01)
*H04L 7/00* (2006.01)

(52) U.S. Cl.
CPC ...... *H04L 12/40058* (2013.01); *H04L 7/0087* (2013.01); *H04L 25/03012* (2013.01); *H04L 25/03343* (2013.01); *H04L 2025/03394* (2013.01); *H04L 2025/03401* (2013.01)

(58) Field of Classification Search
CPC . H04L 7/033; H04L 7/0025; H04L 25/03885; H04L 25/03006; H04L 7/027; H04L 2025/03636; H04L 7/0087; H03L 7/0814; G01R 31/31726; G06F 1/04
See application file for complete search history.

(56) References Cited

U.S. PATENT DOCUMENTS

| | | | |
|---|---|---|---|
| 7,039,118 B1* | 5/2006 | Segaram ............... | H04L 7/0337 375/257 |
| 2005/0210308 A1* | 9/2005 | Best ...................... | G11C 29/02 713/503 |
| 2011/0038386 A1 | 2/2011 | Berthelot et al. | |
| 2012/0300801 A1* | 11/2012 | McLeod .............. | H01S 5/0021 372/29.02 |
| 2015/0256364 A1* | 9/2015 | Mobin .............. | H04L 25/03057 375/233 |
| 2016/0065235 A1* | 3/2016 | Kong ...................... | H03M 9/00 341/143 |
| 2016/0065394 A1* | 3/2016 | Sindalovsky ..... | H04L 25/03012 375/371 |
| 2017/0111071 A1* | 4/2017 | Yoo .................... | H04L 25/03146 |
| 2017/0201321 A1* | 7/2017 | Uysal .................. | H04B 10/116 |
| 2017/0302431 A1* | 10/2017 | Lugthart ............... | H04L 7/0054 |

OTHER PUBLICATIONS

A. Ho, et al., "Common-Mode Backchannel Signaling System for Differential High-Speed Links", IEEE Symp. VLSI Circuits, Jun. 2004.

* cited by examiner

*Primary Examiner* — Khanh C Tran

(57) ABSTRACT

Methods, integrated circuits and computer-readable media for communicating back-channel data over a data link by modulating the phase or frequency of a clock signal of a data signal transmitted over the data link. Slow modulation of the clock signal allows it to be detected and extracted by a receiver without affecting the integrity or bit rate of the data signal. Some embodiments allow the functionality to be implemented without the use of extra hardware in the transmitter or receiver or either.

20 Claims, 12 Drawing Sheets

FREQUENCY/PHASE-SHIFT-KEYING FOR BACK-CHANNEL SERDES COMMUNICATION

FIELD

The present disclosure relates to serializer-deserializers (SerDes). In particular, the present disclosure relates to methods and systems for backchannel communication from SerDes receivers to SerDes transmitters.

BACKGROUND

A serializer-deserializer (SerDes, or SERDES) is a pair of functional blocks used for high-speed communication between two systems, such as two application-specific integrated circuits (ASICs), across a limited input/output link between the two systems.

Generally, each system will include at least one SerDes transmitter and at least one SerDes receiver, thereby allowing bidirectional communication, although some such SerDes will use only transmitters on the first system and only receivers on the second system. In any case, SerDes links are traditionally designed with standalone transmitter (TX) and receiver (RX) sides.

For a SerDes link to operate most efficiently, it is desirable for the TX and RX ends of the link to be able to share performance-related information. However, most SerDes systems do not have an inherent ability to communicate this information between the transmitter and receiver or vice-versa. SerDes links communicate high-speed data from chip to chip, but are not able to add overhead data to live bit streams, so the performance-related information cannot be encoded in the data stream. Therefore, it is not possible to communicate performance-related information when the data link is active.

One known solution to this problem is to use dedicated circuitry, pins and physical wire connections to create a backchannel for communication of performance-related information or other metadata between the TX and RX sides of the SerDes. However, this is a large, undesirable overhead since the number of pins available is tightly constrained. A block diagram of an example implementation of such a physical backchannel is shown in FIG. 1. A SerDes 100 forms a portion of a first application-specific integrated circuit (ASIC) 102 and a second ASIC 104. The SerDes 100 includes a transmitter macro 106 and a receiver macro 108. A data channel 110 allows the transmitter 106 to transmit data to the receiver 108. Physical backchannels 112 are created using physical hardware, such as pins and wires of a data connection. These backchannels 112 may be unidirectional or bidirectional, depending on the physical hardware set aside for them.

The data link may also be used to communicate performance information or other metadata, but not during operation. Existing standards and implementations use existing channels to pass data between chips at startup time as part of a hand-shaking procedure. This hand-shaking usually consists of two parts: auto negotiation (AN) and link training (LT). Auto negotiation is used mainly to configure both sides (TX and RX) to use the same standard, duplex mode and data rate. Link training is used mainly to configure TX amplitudes and equalizer settings. This communication typically happens at lower speed and requires that high speed pseudo-random bit sequence (PRBS) be transmitted periodically so that clock and data recovery (CDR) remains phase-locked.

Since this all occurs only at start up, it cannot respond to any changes in conditions during operation. Links must therefore be set pessimistically, which hurts efficiency. This also affects the speed at which links can be turned on, which further hurts efficiency.

Some techniques have been developed to embed analog back-channel communication on existing data lines.

For example, changing the common mode level of the differential TX or RX circuits may allow some metadata to be embedded in the data signal while the link is operational. One such technique is disclosed by A. Ho, et al., "Common-Mode Backchannel Signaling System for Differential High-Speed Links", *IEEE Symp. VLSI Circuits*, June 2004. FIG. 2 shows an example implementation of such a technique from that publication.

However, it is difficult for this kind of modulation technique to have no impact on the signal integrity of the data, especially at very high data rates. It also requires a differential (two-wire) electrical physical link—it is not suitable for optical links or single-ended (one-wire) electrical links.

Another similar modulation technique is disclosed by P. Ta, et al., "Using Frequency Divisional Multiplexing for a high-Speed Serializer/Deserializer with Back Channel Communication", U.S. Patent Application Number 20110038386, Published Feb. 17, 2011. SerDes links are sometimes alternating current (AC) coupled—where they are, the low-frequency part of the spectrum may be used for back-channel communication.

FIG. 3 shows an example implementation of such a technique from that publication. A circuit is shown having a first SerDes and second SerDes. The first SerDes has a forward channel driver as well as a receiver for reverse channel communication; the second SerDes has a reverse channel driver and a receiver for forward channel communication. Two AC coupling capacitors enable the circuit to utilize frequency division multiplexing, which enables bi-directional transmission across a communications medium. The forward channel passes relatively high frequency signals output by the forward channel driver through a first AC coupling capacitor, which are transmitted through the communications medium and passed through a second AC coupling capacitor to be received by the forward channel receiver. On the reverse channel, the reverse channel driver passes relatively low frequency signals, which bypass the second AC coupling capacitor through DC coupling, are transmitted through the communications medium, bypass the first AC coupling capacitor, and are received by the reverse channel receiver through DC coupling.

However, this technique is not applicable to links that are not AC coupled. It requires additional pins and external capacitors in order to set the low-frequency cutoff correctly. It also adds complexity to the analog data path, which may introduce noise or other non-idealities. As with the common mode modulation technique disclosed by Ho et al., it requires an electrical physical link and so is not suitable for optical links.

SUMMARY

The present disclosure describes example systems, methods and computer-readable media to communicate additional information between compatible SerDes using phase and/or frequency modulation of the payload data, without interfering with the payload data or increasing the number of pins or physical wire connections required between the TX and RX SerDes macros. This can be used as a side-channel or back-channel to communicate metadata, information about the channel or signal quality, etc. Specific embodiments are described that require minimal additional power consumption and cost compared with existing common SerDes architectures.

According to some aspects, the present disclosure describes a integrated circuit for communicating back-channel data over a SerDes data link, comprising a digital modulator for receiving back-channel data and modulating at least one clock signal to encode the back-channel data, producing a modulated clock signal; and a transmitter for receiving a data input signal and the modulated clock signal and transmitting over the SerDes data link a data output signal encoded by the modulated clock signal.

According to a further aspect, the digital modulator encodes the back-channel data using frequency-shift keying.

According to a further aspect, the digital modulator encodes the back-channel data using phase-shift keying.

According to a further aspect, the digital modulator modulates the clock signal at a global clock source.

According to a further aspect, the data output signal has two or more lanes, the clock signal comprises a clock tree having two or more branches governing two or more lanes of the data output signal, and the digital modulator modulates one or more branches of the clock tree.

According to a further aspect, the digital modulator applies the same modulation to two or more branches of the clock tree.

According to a further aspect, the digital modulator applies different modulation to two or more branches of the clock tree.

According to a further aspect, the digital modulator modulates the clock signal at a phase interpolator.

According to a further aspect, the modulation applied by the digital modulator introduces clock signal delays greater than 0.1 unit interval.

According to a further aspect, the modulation applied by the digital modulator introduces clock signal delays having a duration at least as long as two unit intervals.

According to a further aspect, the device or system further comprises a receiver configured to receive the data output signal from the SerDes data link, capture multiple samples of the data output signal, and average the multiple samples in order to detect clock modulation levels in the data output signal.

According to a further aspect, the digital modulator comprises a processor configured to execute instructions for performing the modulation.

According to a further aspect, the SerDes data link comprises an electrical link.

According to a further aspect, the SerDes data link comprises an optical link.

According to a further aspect which can be combined with other embodiments disclosed herein, the disclosure describes an integrated circuit for communicating back-channel data over a SerDes data link, comprising a receiver for receiving a data signal over the SerDes data link, detecting modulation of at least one clock signal encoding the data signal, and extracting back-channel data from the modulation of the clock signal.

According to a further aspect which can be combined with other embodiments disclosed herein, the disclosure describes a method for communicating back-channel data over a SerDes data link comprising the steps of modulating a clock signal to encode back-channel data, producing a modulated clock signal; and transmitting over the SerDes data link a data output signal encoded by the modulated clock signal.

According to a further aspect, the step of modulating comprises modulating the clock signal at a global clock source.

According to a further aspect, the data output signal has two or more lanes, the clock signal comprises a clock tree having two or more branches for encoding two or more lanes of the data output signal, and the step of modulating comprises modulating one or more branches of the clock tree.

According to a further aspect, the step of modulating comprises modulating the clock signal at a phase interpolator.

According to a further aspect which can be combined with other embodiments disclosed herein, the disclosure describes a non-transitory computer-readable medium containing instructions enabling one or more processors of an electronic communication system to execute the steps of modulating a clock signal to encode back-channel data, producing a modulated clock signal; and transmitting over a SerDes data link a data output signal encoded by the modulated clock signal.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
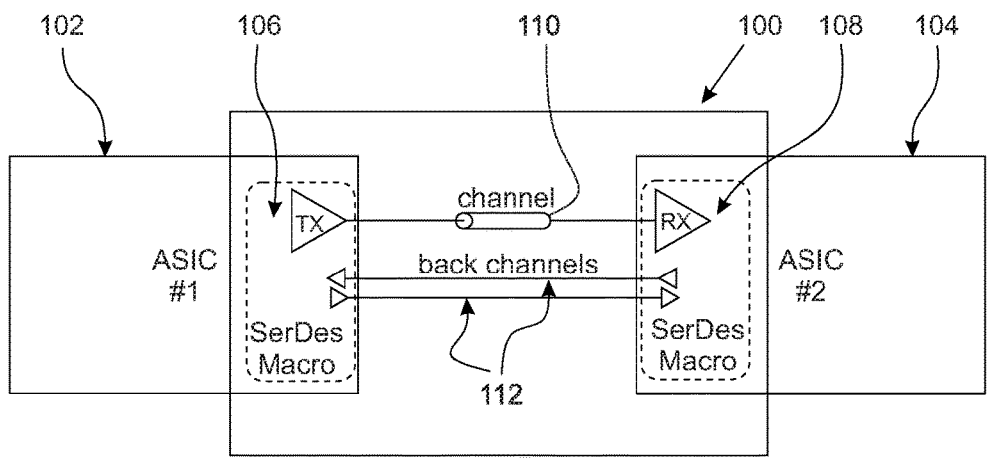
FIG. 1 is a block diagram showing a known example implementation of backchannels created between the transmitter and receiver portions of a SerDes using dedicated physical hardware.
Figure 2:
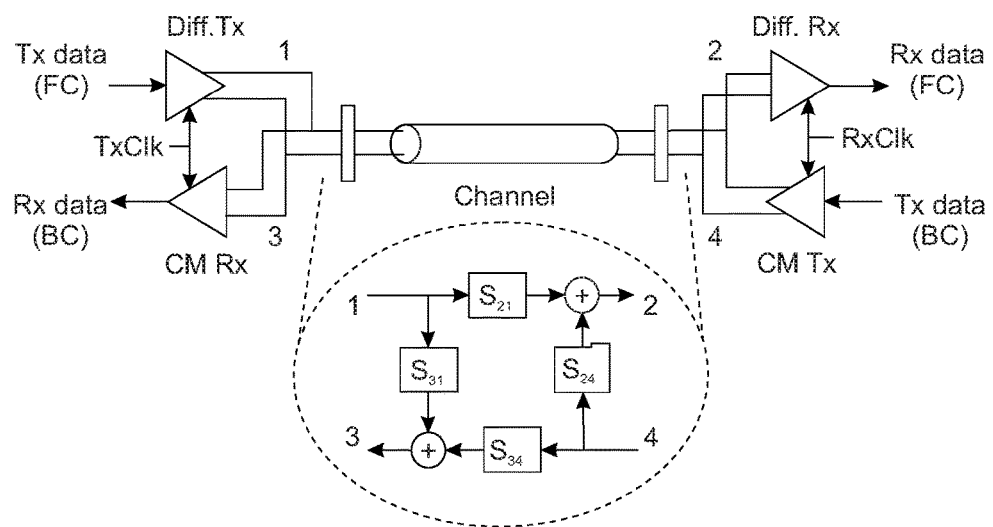
FIG. 2 is a block diagram showing a known example implementation of a system for using the data channel between a SerDes transmitter and receiver portions to carry backchannel data by modulating the common mode, as described in A. Ho, et al., "Common-Mode Backchannel Signaling System for Differential High-Speed Links", *IEEE Symp. VLSI Circuits*, June 2004.
Figure 3:
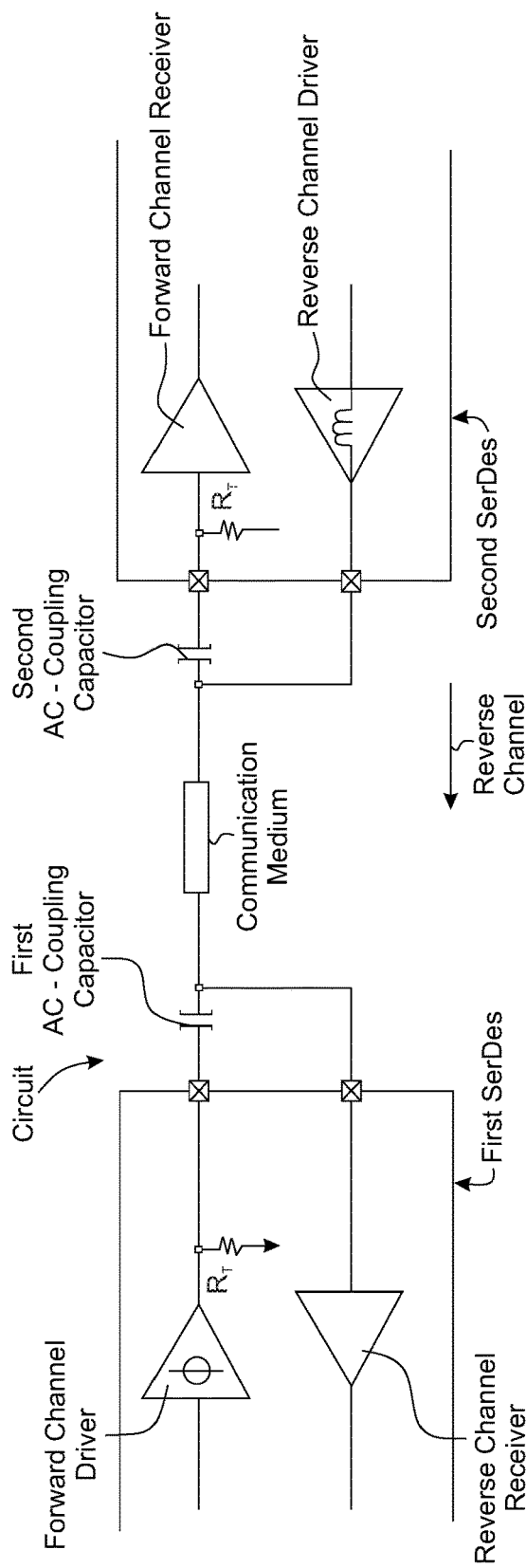
FIG. 3 is a known example implementation of a system for creating a backchannel between an AC-coupled SerDes transmitter and receiver portions by using the low-frequency part of the spectrum for back-channel communication, as described in "Using Frequency Divisional Multiplexing for a high-Speed Serializer/Deserializer with Back Channel Communication", U.S. Patent Application Number 20110038286, Published Feb. 17, 2011.

The present disclosure describes example systems, methods, and computer-readable media that enable a serializer-deserializer (SerDes) to modulate the frequency or phase of its clock signal to create a backchannel.

In many SerDes applications, the receiver (RX) clock is extracted from the received bit stream using clock and data recovery (CDR). If the frequency of the transmitter (TX) clock is modulated slowly, then the CDR can track this modulation without compromising the received data. Modulating the SerDes clock frequency can therefore be used for low-speed back-channel communication without requiring additional pins or wires.

Various types of information can be communicated over this back-channel, including various performance-related information. Performance-related information which would be valuable to share include process/voltage/temperature (PVT) information about the respective chips (this is increasingly important as variation increases in new metal-oxide-semiconductor (CMOS) technologies); channel loss; received signal strength (for example, if an RX is receiving a strong signal with an open eye, it could communicate this to the TX, which could in turn reduce its drive strength in order to conserve power); bit error rate (BER) of the received data stream; crosstalk aggressor information; and phase relative to adjacent links (for modulation schemes that make use of this information).

As discussed in the Background section, auto negotiation (AN) and link training (LT) schemes that perform set-and-forget calibration of a SerDes data link at startup are known techniques for communicating performance information or other metadata between SerDes TX and RX portions, even though they cannot continue to supply such information during link operation. In many conventional SerDes applications, dynamic variations in link conditions are small enough to neglect, making AN and LT sufficient to optimize or calibrate operation of the SerDes over the link. However, this may no longer be the case in deep sub-micron CMOS technologies: low supply voltages have circuits operating closer to their limits, and transistor aging may have more drastic long-term effects. Furthermore, power consumption limitations increasingly require the best possible efficiency. Every milliwatt of power that can be saved by reducing power where possible is valuable. All of these factors favour the use of a system capable of communicating performance-related information or other metadata between the TX and RX sides of a SerDes during link operation, thereby potentially allowing dynamic optimization of SerDes parameters during operation to improve signal integrity and reduce power consumption over a data link, including an optical data link.

Throughout this specification, the term "back-channel" is used to refer to a communication channel other than the main data bitstream of a SerDes between the transmitter and receiver. It is not limited to a channel carrying information in a specific direction, e.g. from receiver to transmitter or vice-versa. This could also be called a "side channel", and the terms "back-channel" and "side channel" are taken as equivalents for the purpose of this specification and the claims.

Figure 4:
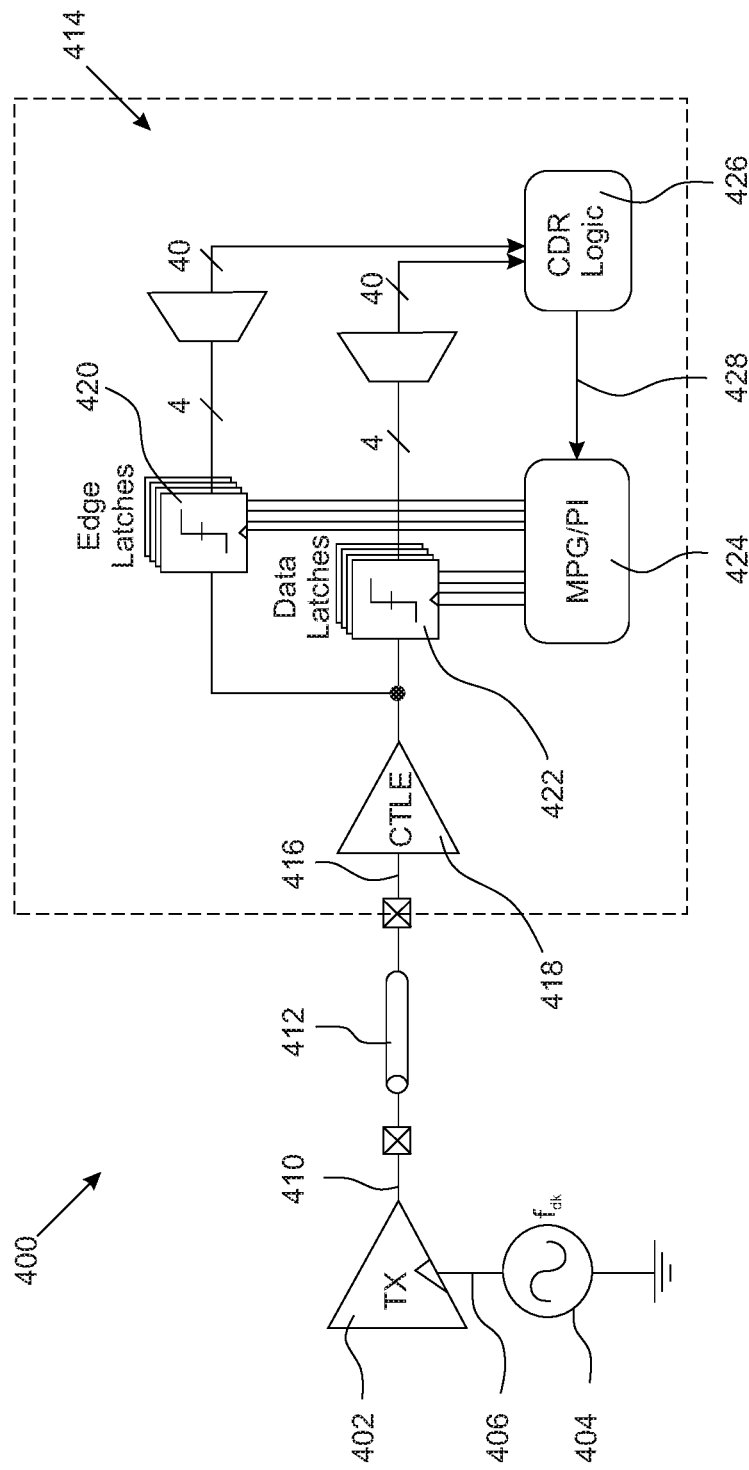
FIG. 4 is a block diagram of a first example embodiment as a SerDes circuit configured to use clock frequency or phase modulation to create a back-channel over a data link.

FIG. 4 is a simplified circuit diagram showing an example implementation of a SerDes configured to modulate the frequency and/or phase of the clock signal to create a back-channel over the data link. The SerDes 400 includes a transmitter 402 fed by a clock source 404. The clock source 404 generates a clock signal 406 having a slowly changing frequency and/or phase. The transmitter output 410 is a regular data signal. This transmitter output 410 passes across a data channel 412 and is received by a SerDes receiver 414 as a received bit stream 416. The received bit stream 416 is fed into a continuous time linear equalizer (CTLE) 418. Edge latches 420 and data latches 422 are used to recover the clock and data information from the CTLE output using a multi-phase generator or phase interpolator (MPG/PI) unit 424 controlled by clock and data recovery (CDR) logic 426. The CDR logic 426 is capable of controlling the MPG/PI unit 424 to recover the clock and data signals while also extracting from the slowly-changing frequency and/or phase of the recovered clock signal a phase code 428 that mirrors the modulation of the transmitter's clock source 404.

The example embodiment illustrated in FIG. 4 may have certain advantages over the prior art. It may be able to work at startup time and/or in the background during mission mode operation when the data link is active. It may therefore be able to respond dynamically to changes in the system.

It may not require any additional pins or lines between TX and RX chips.

It may also be digital in nature, which simplifies implementation in deep submicron complementary metal-oxide-semiconductor (CMOS) and potentially makes it relatively easy to port from one technology to another.

It may not introduce traffic overhead to the main data link. The data rate may therefore not be affected.

It may not affect analog signals in the main data path, unlike modulating the common-mode level of the signals.

It may be implemented with either electrical or optical physical links.

The example system illustrated in FIG. 4 only sends data from the transmitter macro on the first ASIC to the receiver macro on the second ASIC. In some embodiments, pairs of such transmitters and receivers on both ends of the SerDes may be used to implement bidirectional communication. For example, a SerDes may include one or more systems as shown in FIG. 4 transmitting from the first ASIC to the second ASIC, and one or more such systems transmitting back from the second ASIC to the first ASIC. The RX and TX slices or macros on each ASIC may in some embodiments pass back-channel data between each other, allowing back-channel data to travel in either direction between ASICs.

Figure 5:
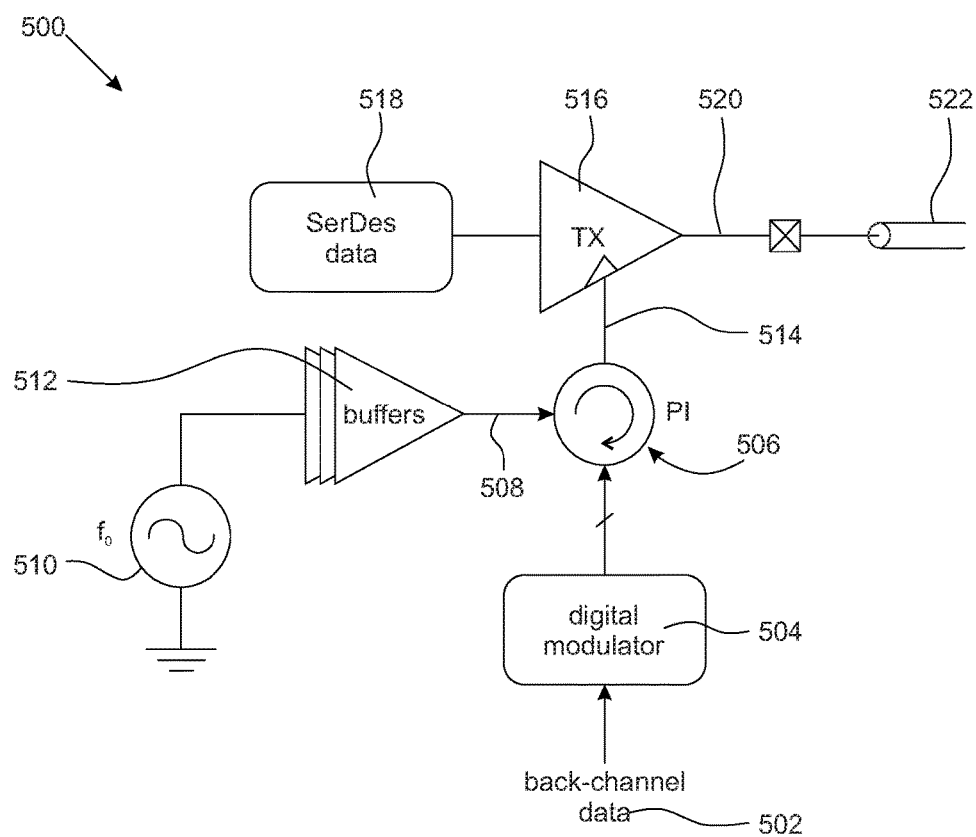
FIG. 5 is a block diagram of a second example embodiment as a SerDes transmitter macro configured to create a back-channel over a data link by modulating the phase or frequency of a clock signal by modulating a phase interpolator applied to the clock signal.

FIG. 5 shows a second example embodiment as a transmitter circuit 500. Back-channel data 502 is encoded by digital modulator 504 using frequency shift keying (FSK) to generate slow, constant phase rotation using a phase interpolator (PI) 506. The PI 506 encodes this data into one or more lanes of a clock tree 508 generated by a clock source 510 fed through clock buffers 512. A transmitter 516 receives the SerDes data 518 and the modulated clock tree 514 to generate the outgoing data stream 520 sent over the data link 522. The transmitter 516 therefore takes two input signals (the modulated clock tree 514 is the clock input signal, and the SerDes data 518 is the data input signal) and generates one output signal (the outgoing data stream 520 is the data output signal).

In some embodiments that carry out the modulation using firmware or other software, the digital modulator 504 may be a processor executing software instructions.

In many SerDes implementations, a PI already exists in the transmitter slice in order to align serialization and deserialization of various lanes. This technique effectively creates a small frequency offset—on the scale of clock frequency parts per million (PPM)—for the lane or lanes so modulated.

Various embodiments may use different modulation schemes for the back-channel data.

In one example embodiment, a positive PPM modulation may be used to encode a "1", while a negative PPM modulation may be used to encode a "0". The PPM modulation should be big enough for easy detection, but not enough to create CDR tracking problems.

CDRs generally only have the ability to track a finite frequency offset—for example, a conventional CDR may only be able to track up to 200 PPM of jitter or other clock frequency offset. Some amount of frequency offset may result randomly in a system, e.g. jitter induced by non-idealities in the hardware or environment. Applying frequency or phase modulation to a signal thus detracts from the jitter budget of a system's CDR, making it more vulnerable to loss of signal integrity due to large amounts of jitter or other random frequency offset. So, if 100 PPM frequency modulation is introduced for a back channel, only an additional 100 PPM of "random" (i.e. unintentional) frequency offset can be tolerated in the system. A slower modulation (e.g. 50 PPM) leaves more robustness in the CDR to track random frequency offsets (in this example, 150 PPM), but it also results in a slower data rate communicated through the back channel. Some embodiments may thus apply frequency modulation in the amount of 100 PPM (i.e. a clock signal of 10 GHz would be modulated by this technique to a frequency of 10.001 GHz), while others may employ frequency modulation in the range of 50-100 PPM or 100-200 PPM. Frequency modulation above 200 PPM may be used in some systems but may introduce data signal integrity problems when used with convention CDR circuits on the receiver end, and changing a CDR circuit to permit it to be used with this magnitude of frequency modulation could result in performance losses. Frequency modulation of 400 PPM or higher is likely to be very intolerant of any other sources of jitter in the system.

The unit interval (UI) of the clock and/or data signal refers to one symbol period of the main data being communicated over the data link, and may also be referred to as the duration of one clock cycle. The frequency of the clock determines the duration of a unit interval, so a 10 GHz (gigahertz) clock would take 100 picoseconds (ps) to finish one cycle, giving it a UI of 100 ps. In a 100 PPM frequency modulation of a 10 GHz clock signal, the (positively) modulated frequency would be 10.001 GHz. Thus, whereas the 10 GHz clock would take 100 picoseconds (ps) to finish one cycle, the 10.001 GHz clock will only take 99.99 ps to finish one cycle. If the two clocks were compared after 100 ps, the 10.001 GHz clock would be slightly ahead of the 10 GHz clock, i.e. it would have a positive phase offset with regard to the 10 GHz clock. In this case it would be 0.01 ps ahead, which corresponds to a phase difference of 0.01 ps/100 ps*360 degrees=0.036 degrees. As time goes by, this phase difference would get larger and larger until eventually, the CDR would need to change the phase of its clock to stay aligned with the data. This would result in a staircase like the one graphed in FIG. 7, which is discussed in detail below. If the frequency offset were less than 100 PPM, this staircase would manifest at a slower speed, since it would take longer for the phase difference to accumulate. The lower the modulation PPM, the longer it would take for a bit to get passed through the back channel. As outlined above, a 100 PPM frequency offset would take 360 degrees/0.036 degrees=10,000 cycles (or 1 microsecond) to complete one full stair case. A 50 PPM offset would take twice as long. If one complete staircase represents a bit (in some embodiments a bit could be encoded in more or less than a full staircase), then the 100 PPM system can send 1 bit every 1 microsecond, or 1 million bits per second. Other embodiments with different back-channel data rates could also be implemented: a 0.1 PPM offset could be used to generate a back-channel data rate of 1 thousand bits per second, for example, or a 0.0001 PPM offset to generate a back-channel data rate of 1 bit per second. Thus, a lower value of PPM for the frequency modulation results in a slower data rate for the back-channel, but is less likely to result in frequency shifts that would disrupt the integrity of the data signal. Similarly, if the duration of a bit transmission is set too short, it becomes difficult to distinguish the modulated staircases from other random variations in the recovered clock phase due to jitter, noise, or other artifacts. This must be balanced against the increased back-channel data rate gained by decreasing the duration of a bit transmission for the back-channel data.

In alternative embodiments, phase-shift keying (PSK) may be used in place of frequency-shift keying (FSK). Whereas FSK represents bits by monotonic (staircase) increases or decreases in phase, PSK represents bits with different a time-varying phase offset.

Figure 14:
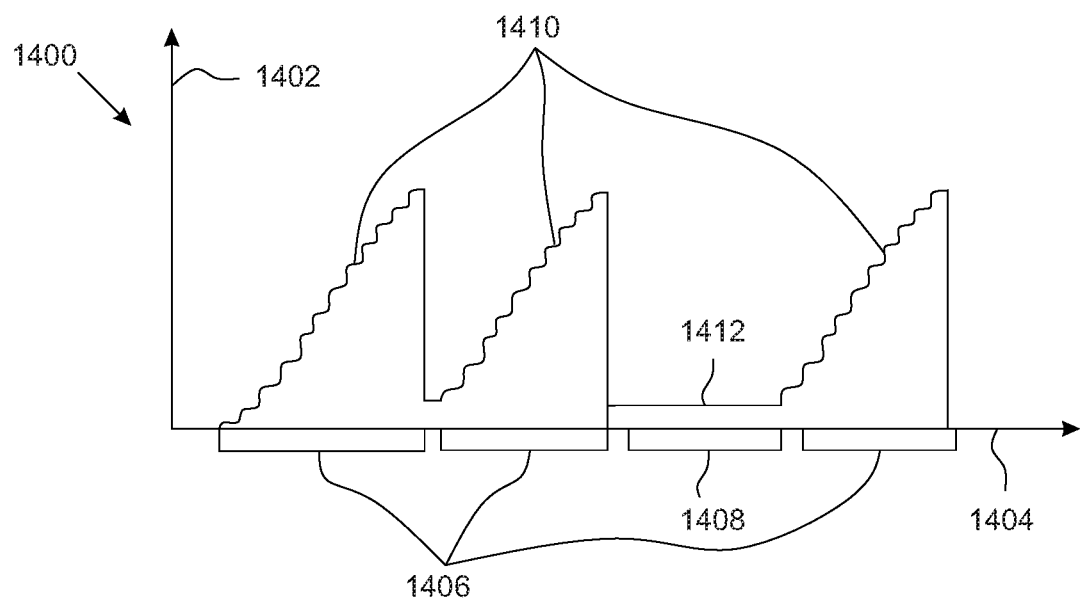
FIG. 14 is a graph of the phase code of a clock against time using FSK to encode back-channel data under an example modulation scheme.
Figure 15:
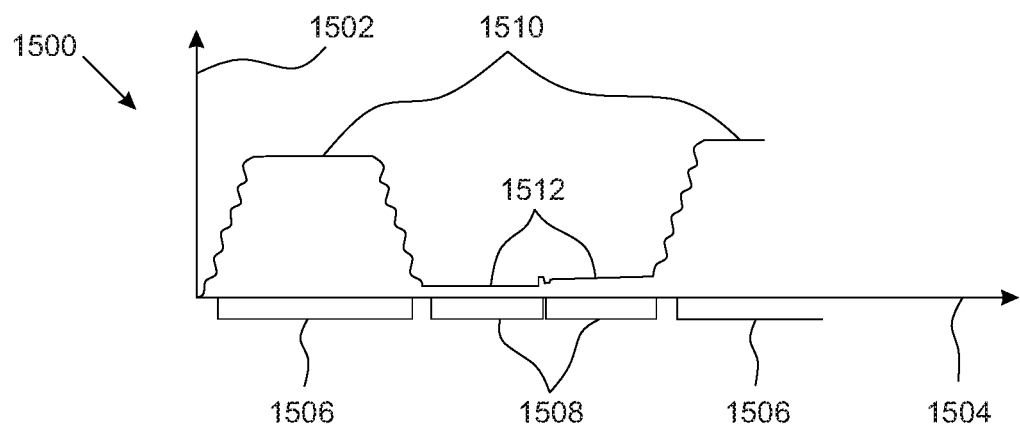
FIG. 15 shows a graph of the phase code of a clock against time using PSK to encode back-channel data under an example modulation scheme.

The difference between FSK and PSK is illustrated by the graphs shown in FIG. 14 and FIG. 15.

FIG. 14 is a graph 1400 of the phase code 1402 of a clock against time 1404 using FSK to encode back-channel data under an example modulation scheme. In this embodiment, the ascending staircases 1410 encode "1" bits 1406, while the flat portions 1412 encode "0" bits 1408.

In contrast, FIG. 15 shows a graph 1500 of the phase code 1502 of a clock against time 1504 using PSK to encode back-channel data under an example modulation scheme. In this embodiment, the high amplitude portions 1510 encode "1" bits 1506, while the low amplitude portions 1512 encode "0" bits 1508.

Figure 6:
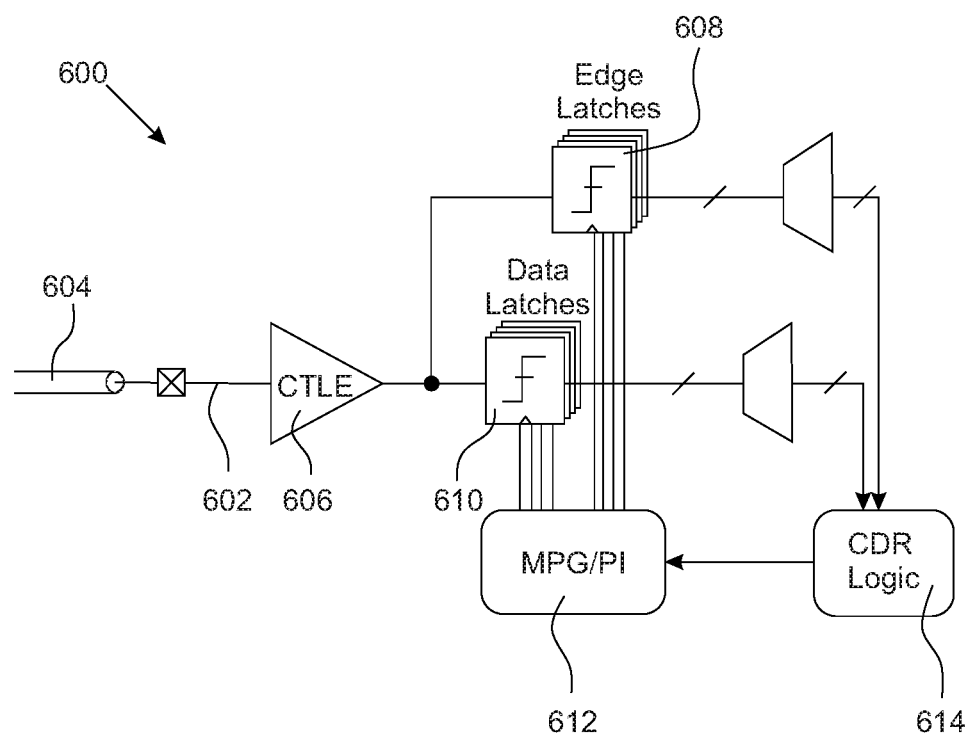
FIG. 6 is a block diagram of a first example embodiment as a SerDes receiver macro configured to detect clock frequency or phase modulation to extract back-channel data from a data link.

FIG. 6 shows a third example embodiment as a receiver circuit. Here, the PPM offset introduced in a transmitter configured to encode back-channel data in the data stream using clock phase shifts (such as the transmitter of FIG. 5)

will be visible in the frequency tracking loop of the CDR. The receiver circuit uses digital monitoring of the shift of the frequency tracking loop to detect the back-channel signal. In many SerDes implementations, this can be done with no additional analog circuitry on the RX side, but the addition of a frequency filter, such as a band-pass filter (BPF) or a low-pass filter (LPF), in the CDR monitor could be used to help isolate the desired back-channel signal from random variations in the system. Some such embodiments could be completely firmware-driven and would have no impact on the data path. A firmware-only or software-only implementation would use a processor to execute firmware or software instructions to perform the modulation and demodulation of the clock signal.

FIG. 6 shows a SerDes receiver circuit 600 that receives a data stream 602 across a data link 604. Encoded in the clock phase of the data stream 602 is back-channel data, such as the back-channel data 502 of the example transmitter 500. A CTLE 606 equalizes the incoming data stream 602, and edge latches 608 and data latches 610 driven by a MPG/PI unit 612 recover the clock and data signals. The MPG/PI unit 612 is controlled by a CDR logic unit 614 configured to recover slow clock phase modulation information from the data signal 602, which represents the back-channel data (such as back-channel data 502) encoded in the data stream by the transmitter (such as transmitter circuit 500).

In some embodiments of the systems of FIGS. 4, 5, and 6, a clock frequency offset of 100 PPM may be used to encode the back-channel data. This 100 PPM frequency shift may be introduced at the transmitter between 0.2 and 0.7 microseconds, or between 0.3 and 0.8 microseconds. Different embodiments may use a different PPM for modulation as described above, or they may introduce the delay at a different point in time.

Figure 7:
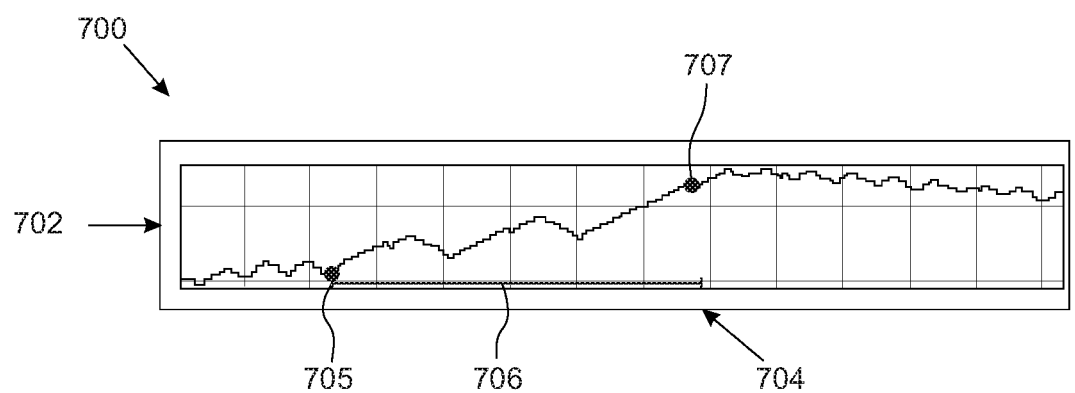
FIG. 7 is a graph of a detected clock phase signal over time in a simulation of the example embodiment as a SerDes receiver as shown in FIG. 8.

FIG. 7 shows a graph 700 of example simulation data for such an embodiments introducing a clock frequency offset of 100 PPM at between 0.2 and 0.7 microseconds. The integral path gain ($K_I$) of an accumulator output is shown on the vertical axis 702, while the horizontal axis 704 is time. The ascending portion 706 between low point 705 and high point 707 shows a positive PPM variation in the clock frequency, indicating a "1" bit value. (In this simulation, the descending portions 708 are the result of jitter in the system—the upwards trend from the intentionally transmitted "1" bit values can be distinguished from the jitter in the system by the CDR using the described techniques.) The time values of this bit transmission correspond to approximately 2 bits of back-channel data encoded per microsecond, or approximately 0.5 microseconds per bit, with the "1" bit being encoded in the frequency increase between low point 705 at about 0.3 microsecond and high point 707 at about 0.8 microsecond.

Figure 8:
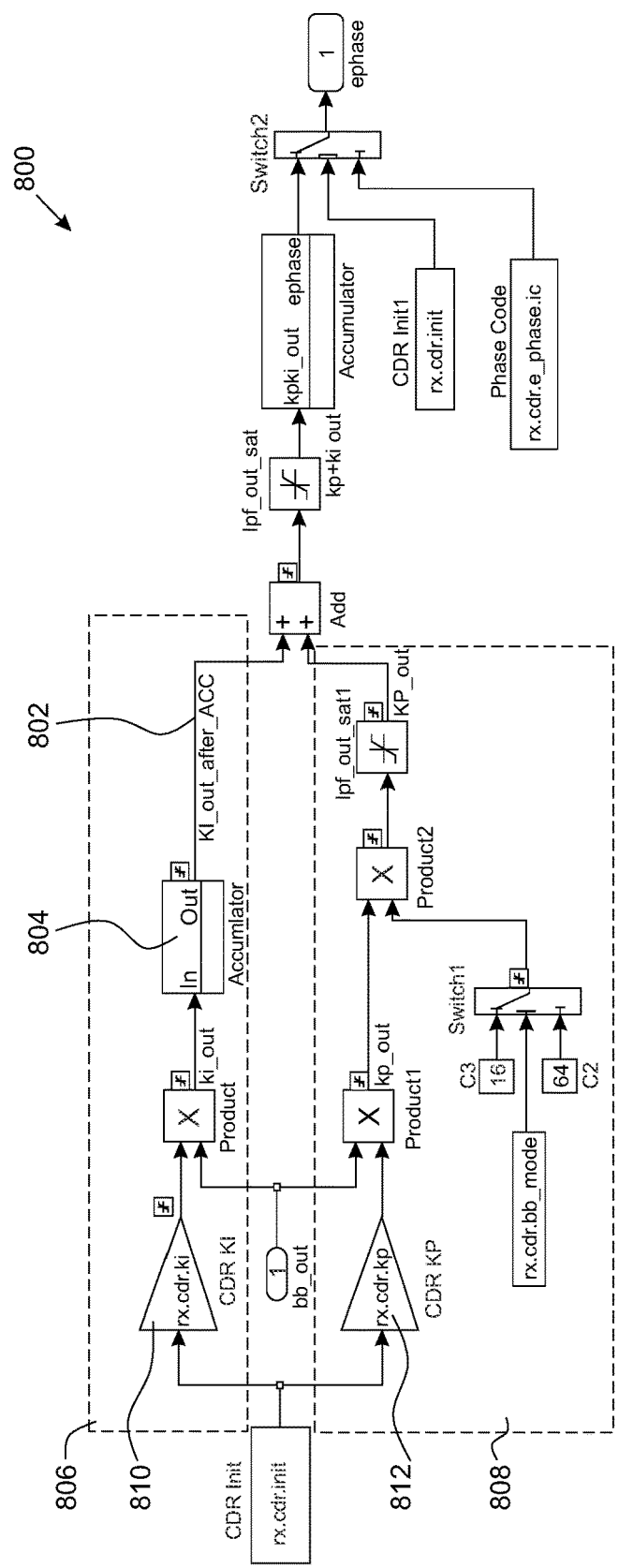
FIG. 8 is a block diagram of a further example embodiment as a SerDes receiver configured to detect clock frequency or phase modulation to extract back-channel data from a data link.

FIG. 8 shows an example block diagram of portions of the CDR and back-channel decoding logic of an example SerDes receiver macro, in the form of a digital filter 800. The top KI (integral gain) path 806 is intended to track frequency variations in the data, while the bottom KP (proportional gain) path 808 is intended for fine tuning the phase of the receiver clock. A weighted sum of the two paths 806, 808 is formed with the weights CDR_KI 810 and CDR_KP 812 chosen to provide stability of the tracking loop.

The back-channel data shown in FIG. 7 represents the output 802 of an accumulator 804 in the integral gain path 806 of the CDR logic.

Various alternative embodiments will now be described.

In some embodiments, the back-channel data may be encoded in the data stream by changing the transmitter frequency or adjusting the clock tree delay, which changes the phase of the transmitted signal.

In some embodiments, the back-channel data encoding scheme could be applied to clock forwarded applications where CDR or some kind of deskew circuit must be used to align the received clock with the data. A clock forwarded receiver could have a dedicated circuit for detecting phase changes in the clock.

In various embodiments, the back-channel encoding could be done globally to all transmitter lanes, to a single transmitter lane, or to some subset of transmitter lanes. Shifting the frequencies of individual lanes could in some embodiments create parallel data links for a higher data rate.

Since the delay of the transmitter clock changes with power supply variations, it may be possible in some embodiments to implement transmitter delay by modulating the power supply of the clock tree. This would mean that no additional circuits would need to be inserted into the clock tree, which could avoid the introduction of additional jitter.

Figure 9:
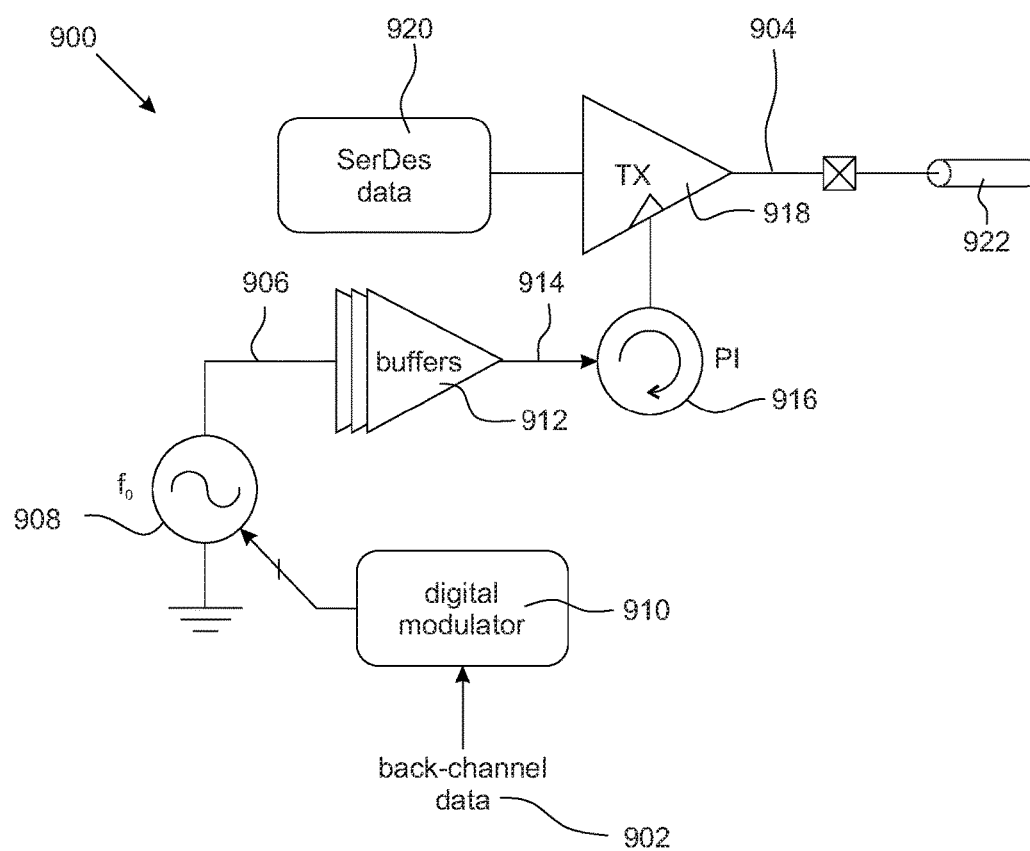
FIG. 9 is a further example embodiment as a SerDes transmitter macro configured to create a back-channel over a data link by modulating the phase or frequency of a clock source.

A further example embodiment as a SerDes transmitter macro 900 modulating the global clock frequency is shown in FIG. 9. In this embodiment, the encoding of back-channel data 902 into the data stream 904 is accomplished by adjusting the global clock frequency. A global clock 906 is generated by a phase-locked loop (PLL) 908, which in this embodiment is inherently capable of frequency adjustment. A digital modulator 910 modulates the PLL 908 to encode the back-channel data 902 into the global clock 906. The global clock 906 passes through clock buffers 912 to generate the clock tree 914, which is fed through a phase interpolator 916 to clock the lanes of a transmitter 918 configured to transmit the SerDes data 920 across the data link 922. The transmitter 918 therefore takes two input signals (the output of the PI 916 is the clock input signal, and the SerDes data 920 is the data input signal) and generates one output signal (the data stream 904 is the data output signal).

This example implementation 900 means that all transmitter 918 lanes will have their frequency modulated in the same way. This may make it easier to keep correct alignment in serializer and deserializer circuits. However, not having individual lane control will limit the amount of data that can be communicated. The receiver clock will also have same modulation, which may potentially complicate 2-way communication.

Figure 10:
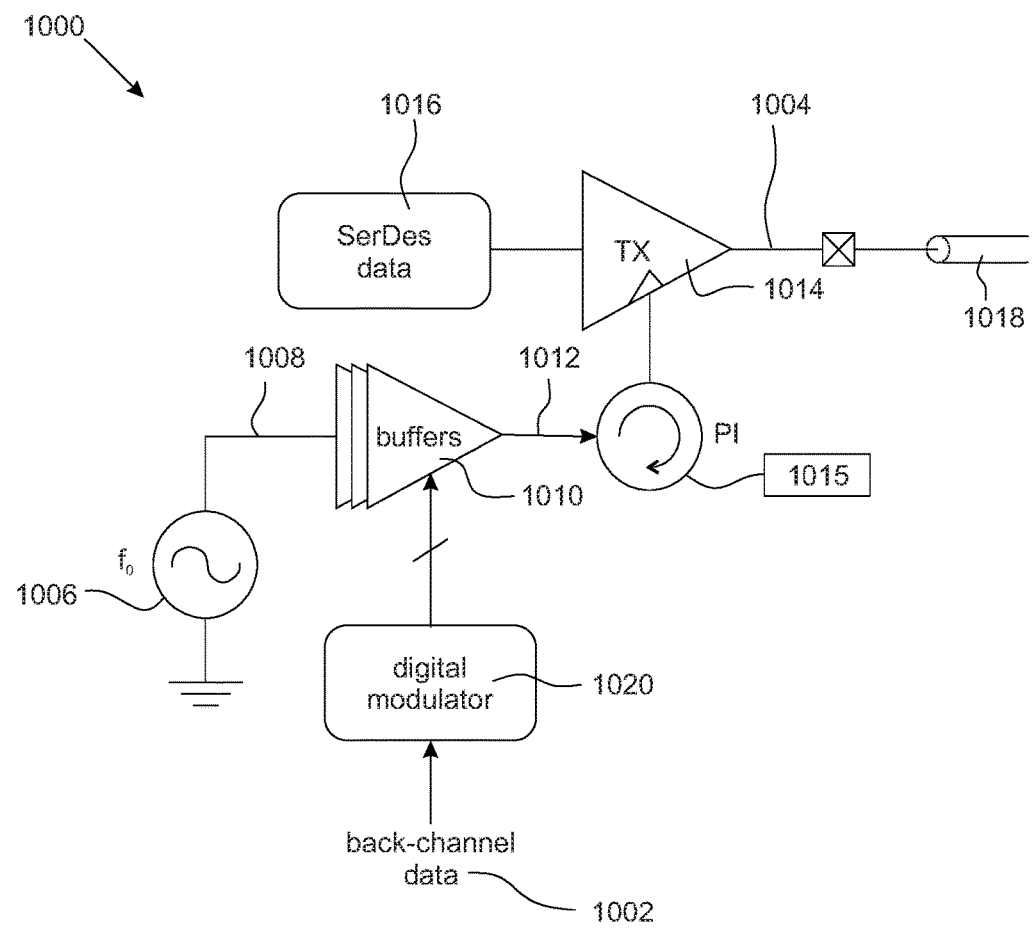
FIG. 10 is a further example embodiment as a SerDes transmitter macro configured to create a back-channel over a data link by modulating the phase or frequency of a clock tree.

A further alternative embodiment as a SerDes transmitter macro 1000 configured to adjust the delay of the clock tree is shown in FIG. 10. In this embodiment 1000, the back-channel data 1002 can be encoded in the data stream 1004 by adjusting the delay in of the clock tree for any given transmitter slice, or alternatively, adjusting the delay in part of the global clock tree.

As in the previous example embodiment 900, a PLL 1006 generates a global clock 1008, and buffers 1010 generate the clock tree 1012. A PI 1015 interpolates the clock tree 1012 to clock the transmitter 1014, which transmits the SerDes data 1016 as a data stream 1004 over the data link 1018.

Here, however, the digital modulator 1020 encodes the back-channel data 1002 into the clock tree 1012 by introducing clock tree delay into one or more branches of the clock tree through the buffers 1010. These clock tree branches encode one or more lanes of the data stream 1004. In some embodiments, the modulation introduced into the different branches may be the same, while in other embodiments the modulation applied to the different branches may be different.

The transmitter 1014 takes two input signals (the output of the PI 1015 is the clock input signal, and the SerDes data 1016 is the data input signal) and generates one output signal (the data stream 1004 is the data output signal).

In such an example embodiment 1000, the clock tree delay introduced by the digital modulator 1020 may not appear very different from normal jitter effects, which a CDR is generally designed to track. The system might therefore need to take steps to ensure that the back-channel data 1002 doesn't get lost in other random jitter. Some embodiments may address this issue by ensuring that the clock tree delay changes are larger than the expected jitter. In other embodiments, the duration of the delay changes could last long enough to allow a receiver to capture multiple samples and average them in order to detect modulation levels.

It should be noted that, in various embodiments, modulation may either be introduced uniformly to all modulated lanes of the data link 1018, or each lane may be modulated differently.

Figure 11:
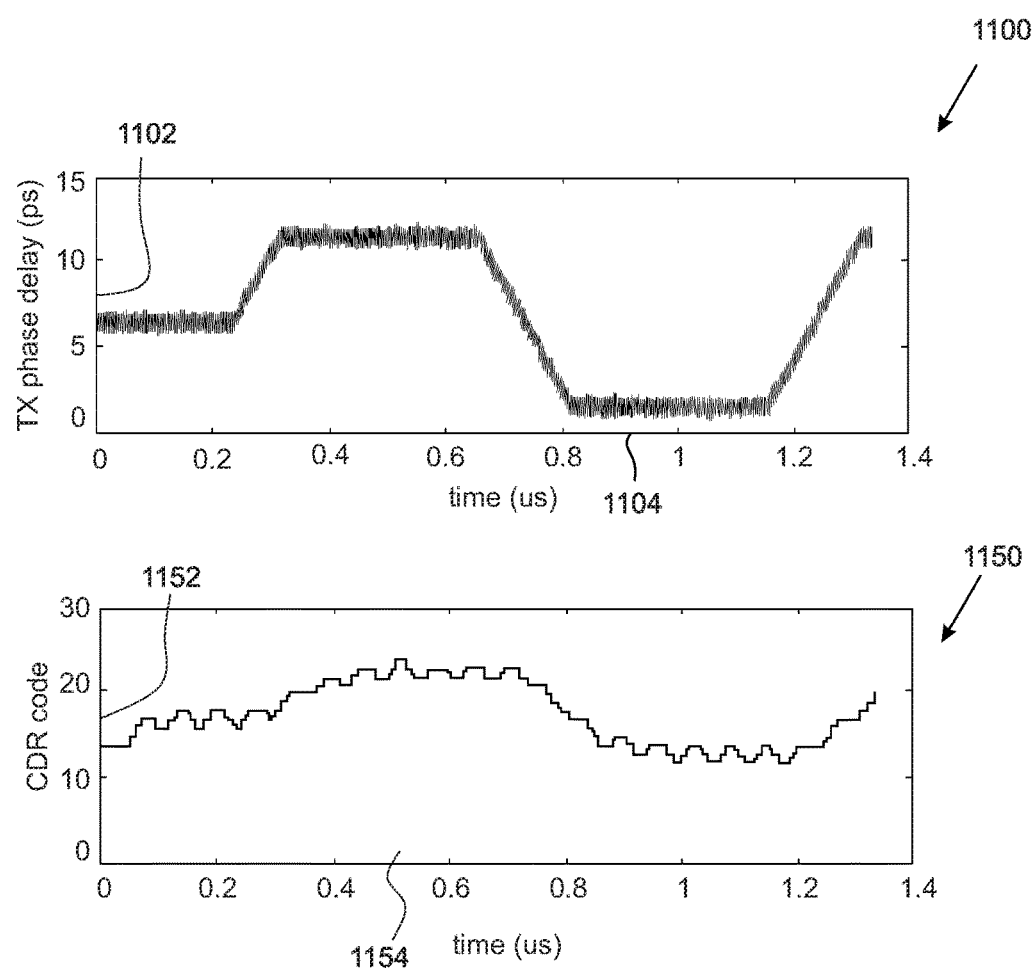
FIG. 11 is a pair of graphs showing clock delay introduced by a SerDes transmitter and CDR code detected at a SerDes receiver over time according to a further example embodiment.

FIG. 11 shows a transmitter delay graph 1100 and a CDR code graph 1150 of simulation data from an example embodiment such as the transmitter macro 1000 of FIG. 10, which encodes back-channel data as clock tree delay. The simulation data assumes a 30 gigabits-per-second (Gbps) data link, with transmitter clock delay varied by 10 picoseconds peak-to-peak, or about 0.3 unit intervals at 1 MHz. The transmitter delay graph 1100 shows transmitter phase delay 1102 as the vertical axis, while time 1104 is the horizontal axis. The CDR code graph 1150 shows recovered CDR code 1152 as the vertical axis, with time 1154 as the horizontal axis.

FIG. 11 illustrates how the transmitter phase delay 1102 can be detected and extracted on the receiver end from the CDR code 1152. Slowly adding or removing delay 1102 is equivalent to changing the transmitter clock frequency for short periods: thus, while this embodiment encodes the back-channel data using clock phase delay modulation, other embodiments could equally effectively use clock frequency modulation. The receiver CDR code 1152 shows good correlation with this transmitter delay 1102, although some noise is apparent in the CDR code 1152. Various embodiments could capture back-channel data from this CDR code 1152 since the detected delay 1102 is larger than other jitters in the example system. A SerDes could also modulate the phase with scrambling and/or a pseudo-random bit sequence (PRBS) code to help distinguish encoded back-channel data from noise.

Figure 12:
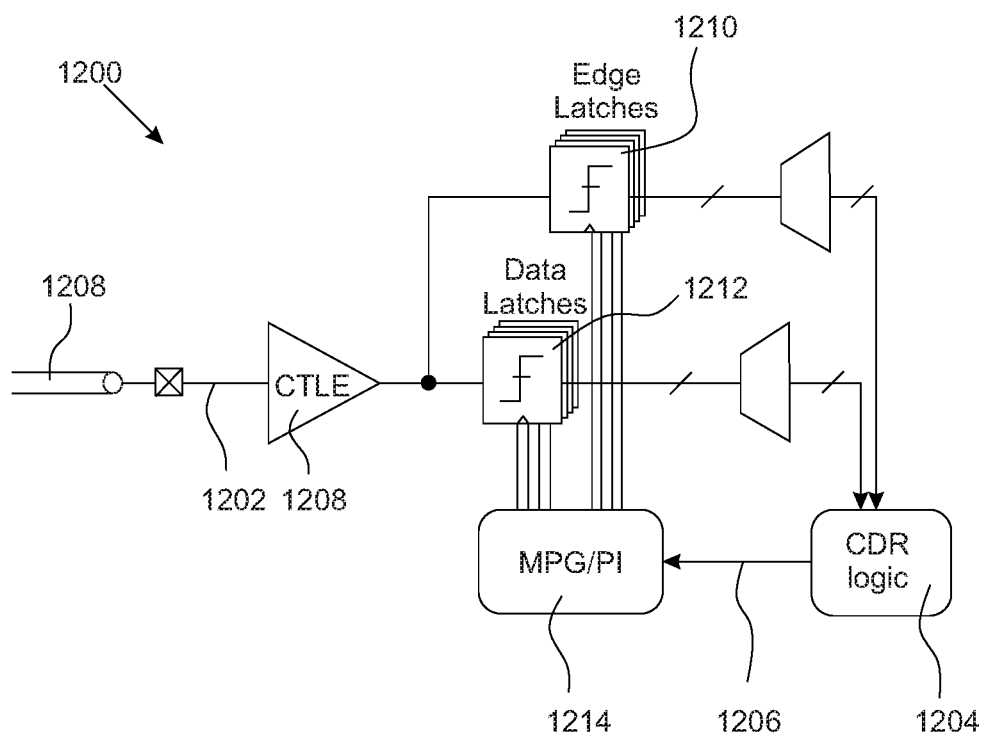
FIG. 12 is a further example embodiment as a SerDes receiver macro with a CDR code used to track jitter and further configured to detect clock frequency or phase modulation to extract back-channel data from a data link.

A further example embodiment is shown in FIG. 12 as an example receiver macro 1200 configured to detect and extract back-channel data from clock tree delay on an incoming data stream 1202 received across a data link 1208. In this embodiment, the CDR logic 1204 of the receiver macro 1200 already produces a digital code 1206 that is used to track jitter. This code 1206 is monitored in the digital domain to detect and extract back-channel data, such as the back-channel data 1022 encoded in the clock tree by the example transmitter macro 1000.

As in the example embodiment 600 of FIG. 6, a CTLE 1208 equalizes the incoming data stream 1202, and edge latches 1210 and data latches 1212 driven by a MPG/PI unit 1214 recover the clock and data signals. The MPG/PI unit 1214 is controlled by a CDR logic unit 1204 configured to recover clock tree delay information from the data signal 1202, which represents the back-channel data (such as back-channel data 1002) encoded in the data stream by the transmitter (such as transmitter macro 1000).

In some embodiments, the back-channel functionality of this receiver macro 1200 can be implemented with no additional analog circuitry on the receiver side.

In some embodiment, the receiver macro 1200 can sample the CDR code 1206 more frequently than the back-channel data rate. This would allow for an average to be computed, which would help distinguish the back-channel data from random jitter.

Various aspects of the above-described embodiments could be recombined to form additional example embodiments. Clock tree delay, as used in transmitter macro 1000, could be used to modulate a global clock as in transmitter macro 900 rather than one or more lanes of a clock tree. Similarly, clock frequency modulation, as used in transmitter macro 900, could be used to modulate one or more lanes of a clock tree rather than a global clock. In other embodiments, a digital modulator could be used to encode the back-channel data in one or more clock signals by modulating the phase interpolator (such as PI 1015) rather than a clock tree or a global clock.

Figure 13:
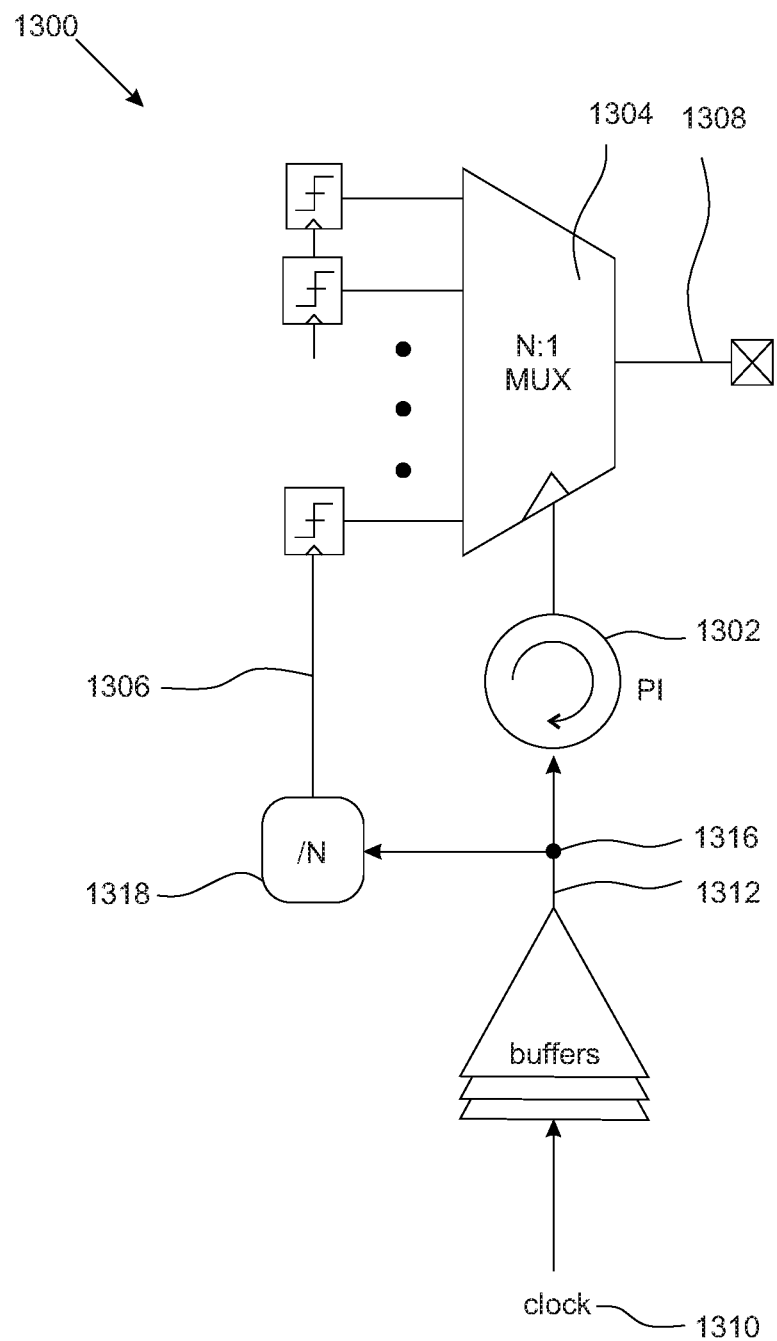
FIG. 13 is an example SerDes transmitter macro to which various embodiments may be applied, including firmware-based embodiments.

Some embodiments may require a particular hardware configuration in TX and/or RX macros of the SerDes, whereas other may be implemented purely as firmware or other software. These embodiments may require additional considerations depending on the specific hardware configuration of the SerDes to which they are applied. FIG. 13 shows an example transmitter macro 1300 to which various embodiments may be applied. The transmitter macro 1300 has a PI 1302 applied to a single serializer, with the PI 1302 used to adjust clock alignment between a multiplexer 1304 and the parallel data 1306 fed into the multiplexer 1304 so that the order of the multiplexer output bits is known. However, this may pose a practical limitation on how much PPM frequency offset can be introduced into the data signal 1308 by a digital modulator used to modulate the global clock 1310, the clock tree 1312, or the PI 1314. Too much phase-shifting or frequency-shifting by the PI 1314 may corrupt the correct order of transmitted bits. In some embodiments, this could be avoided by introducing a second PI at the clock buffer output 1316, before the frequency divider 1318.

Various embodiments may be applied to applications operating according to many short or long-haul communication standards, including OIF, IEEE 10GBASE-KR, IEEE 25GBASE-KR, and other known SerDes communication standards. In some embodiments, the use of clock-phase or clock-frequency modulation would be transparent within these standards, so long as PPM-scale offsets or large low-frequency jitter are tolerated.

Various embodiments would be usable with either electrical or optical physical links.

In some embodiments, the SerDes may use conventional AN and LT techniques at startup, in order to comply with existing standards, and then make use of one of the described techniques in the background, for dynamic adaptation while the data link is operational.

While the above-described embodiments have referred to frequency-shift keying (FSK), phase-shift keying (PSK), and the modulation of the phase, delay, or frequency of a clock signal, other modulation schemes are possible. Any modulation and demodulation of a SerDes clock signal that does not disrupt data link integrity may be used to implement the desired functionality. In theory, aspects of a clock signal other than frequency or phase could be modulated to carry back-channel data.

Some embodiments may be compatible with the use of other back-channel communication techniques, such as common-mode modulation, as long as the limitations of such techniques as described in the Background section are taken into account.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., an embedded processor, a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. An integrated circuit (IC) for communicating back-channel data over a SerDes data link, comprising:
    a digital modulator for receiving back-channel data and modulating at least one clock signal to encode the back-channel data, producing a modulated clock signal; and
    a transmitter for receiving a data input signal and the modulated clock signal and transmitting over the Ser-Des data link a data output signal encoded by the modulated clock signal.

2. The IC of claim 1, wherein the digital modulator encodes the back-channel data using frequency-shift keying.

3. The IC of claim 1, wherein the digital modulator encodes the back-channel data using phase-shift keying.

4. The IC of claim 1, wherein the digital modulator modulates the clock signal at a global clock source.

5. The IC of claim 1, wherein:
    the data output signal has at least two lanes;
    the clock input signal comprises a clock tree having two or more branches for encoding two or more lanes of the data output signal; and
    the digital modulator modulates one or more branches of the clock tree.

6. The IC of claim 5, wherein the digital modulator applies the same modulation to two or more branches of the clock tree.

7. The IC of claim 5, wherein the digital modulator applies different modulation to two or more branches of the clock tree.

8. The IC of claim 1, wherein the digital modulator modulates the clock signal at a phase interpolator.

9. The IC of claim 1, wherein the modulation applied by the digital modulator introduces clock signal delays greater than 0.1 unit interval.

10. The IC of claim 1, wherein the modulation applied by the digital modulator introduces clock signal delays having a duration at least as long as two sampling periods of a SerDes receiver.

11. The IC of claim 10, further comprising a receiver configured to receive the data output signal from the SerDes data link, capture multiple samples of the data output signal, and average the multiple samples in order to detect clock modulation levels in the data output signal.

12. The IC of claim 1, wherein the digital modulator comprises a processor configured to execute instructions for performing the modulation.

13. The IC of claim 1, wherein the SerDes data link comprises an electrical link.

14. The IC of claim 1, wherein the SerDes data link comprises an optical link.

15. An integrated circuit (IC) for communicating back-channel data over a SerDes data link, comprising:
    a receiver for receiving a data signal over the SerDes data link, detecting modulation of at least one clock signal encoding the data signal, and extracting back-channel data from the modulation of the clock signal based on a predetermined modulation scheme.

16. A method for communicating back-channel data over a SerDes data link comprising the steps of:
    modulating a clock signal to encode back-channel data, producing a modulated clock signal; and
    transmitting over the SerDes data link a data output signal encoded by the modulated clock signal.

17. The method of claim 16, wherein the step of modulating comprises modulating the clock signal at a global clock source.

18. The method of claim 16, wherein:
    the data output signal has at least two lanes;
    the clock signal comprises a clock tree having two or more branches for encoding two or more lanes of the data output signal; and
    the step of modulating comprises modulating one or more branches of the clock tree.

19. The method of claim 16, wherein the step of modulating comprises modulating the clock signal at a phase interpolator.

20. A non-transitory computer-readable medium containing instructions enabling one or more processors of an electronic communication system to execute the steps of:
    modulating a clock signal to encode back-channel data, producing a modulated clock signal; and transmitting over a SerDes data link a data output signal encoded by the modulated clock signal.

* * * * *